(12) United States Patent
Koshy et al.

(10) Patent No.: US 7,853,858 B2
(45) Date of Patent: Dec. 14, 2010

(54) EFFICIENT CTC ENCODERS AND METHODS

(75) Inventors: Kamal J Koshy, San Jose, CA (US); Raghavan Sudhakar, Mountain View, CA (US); Prasad Modali, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 1012 days.

(21) Appl. No.: 11/617,251

(22) Filed: Dec. 28, 2006

(65) Prior Publication Data

US 2008/0163022 A1    Jul. 3, 2008

(51) Int. Cl.
  *H03M 13/03* (2006.01)
(52) U.S. Cl. ...................................... 714/787
(58) Field of Classification Search ................ 714/786, 714/787, 793–795
  See application file for complete search history.

(56) References Cited

U.S. PATENT DOCUMENTS

| | | | |
|---|---|---|---|
| 4,809,277 A | 2/1989 | Yano | |
| 6,028,897 A * | 2/2000 | Wang | ......................... 375/265 |
| 6,275,538 B1 | 8/2001 | Ramesh et al. | |
| 6,347,385 B1 | 2/2002 | Cui et al. | |
| 6,862,707 B2 | 3/2005 | Shin | |
| 6,912,684 B2 | 6/2005 | Miyata et al. | |
| 7,127,664 B2 * | 10/2006 | Nicol et al. | .................. 714/792 |
| 2003/0115532 A1 | 6/2003 | Kim et al. | |

FOREIGN PATENT DOCUMENTS

| | | |
|---|---|---|
| KR | 20060121312 | 11/2006 |
| WO | WO-2008082430 A1 | 7/2008 |

OTHER PUBLICATIONS

"PCT Application No. PCT/US2007/006250, Written Opinion mailed Sep. 28, 2007", 6 pgs.
"PCT Application No. PCT/US2007/006250, International Search Report mailed Sep. 28, 2007", 3 pgs.
"Chinese Application Serial No. 200710101630.8, Office Action mailed May 21, 2010", 10 Pgs.
"Taiwan Application Serial No. 96107687, Office Action mailed May 25, 2010", 3 Pgs.

* cited by examiner

*Primary Examiner*—Shelly A Chase
(74) *Attorney, Agent, or Firm*—Schwegman, Lundberg & Woessner, P.A.

(57) ABSTRACT

Embodiments of encoding input data into parity data in mechanisms are described generally herein. Other embodiments may be described and claimed.

20 Claims, 4 Drawing Sheets

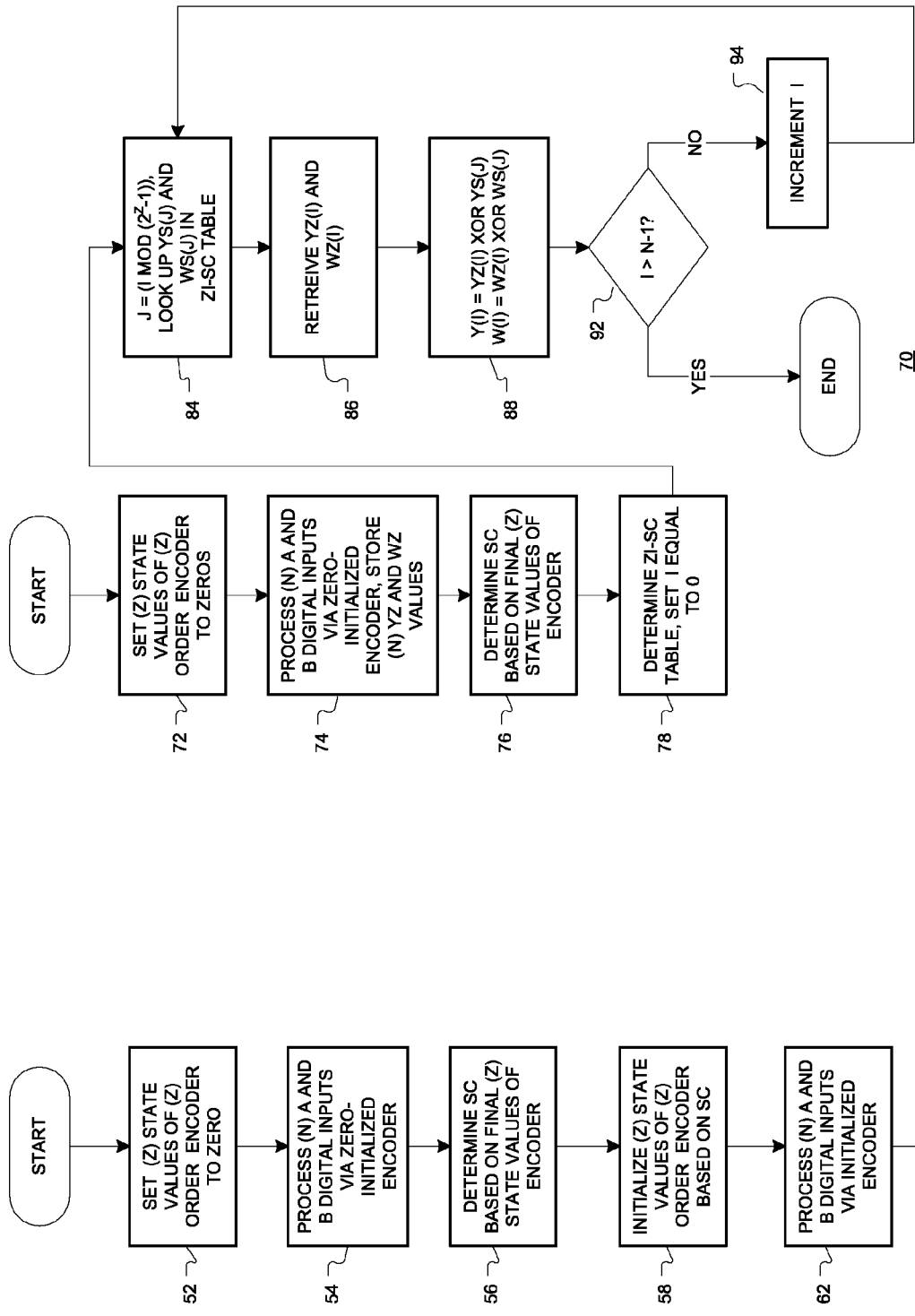

EFFICIENT CTC ENCODERS AND METHODS

TECHNICAL FIELD

Various embodiments described herein relate to digital communications generally, including apparatus, systems, and methods used in wireless communications.

BACKGROUND INFORMATION

An evolving family of standards is being developed by the Institute of Electrical and Electronic Engineers (IEEE) to define parameters of a point-to-multipoint wireless, packet-switched communications system. In particular, the 802.16 family of standards (e.g., the IEEE std. 802.16-2004 (published Sep. 18, 2004)) may provide for fixed, portable, and/or mobile broadband wireless access networks. Additional information regarding the IEEE 802.16 standard may be found in IEEE Standard for Local and Metropolitan Area Networks—Part 16: Air Interface for Fixed Broadband Wireless Access Systems (published Oct. 1, 2004). See also IEEE 802.16E-2005, IEEE Standard for Local and Metropolitan Area Networks—Part 16: Air Interface for Fixed and Mobile Broadband Wireless Access Systems—Amendment for Physical and Medium Access Control Layers for Combined Fixed and Mobile Operation in Licensed Bands (published Feb. 28, 2006). Further, the Worldwide Interoperability for Microwave Access (WiMAX) Forum facilitates the deployment of broadband wireless networks based on the IEEE 802.16 standards. For convenience, the terms "802.16" and "WiMAX" (WiMAX is a trademark of the WiMAX forum) may be used interchangeably throughout this disclosure to refer to the IEEE 802.16 suite of air interface standards.

Wireless communication between wireless devices may experience data corruption due to random noise and multipath distortion. A wireless device may encode input data to generate correlated parity data. The transmitting device may transmit the input data and correlated parity data to a device. The receiving device may process the received input data and correlated parity data to determine whether the received input data has been corrupted and to attempt to recover the transmitted input data. Parity data may be generated using convolutional encoding such as Convolutional Turbo Code (CTC).

CTC encoders may employ a circular-recursive-convolutional systematic encoder (CRCSE) to process input data blocks to generate parity data blocks. Some CTC decoders operate more effectively when the CTC encoder initializes the state values of the CRCSE with known (a priori) values prior to processing input data blocks to generate parity data blocks including setting the initial state values to the final state values. To determine a priori state values for a CRCSE a CTC encoder may process an input data block with a CRCSE having its initial state values set to zero. The CTC encoder may determine the a priori CRCSE state values based on the final state values of the CRCSE after processing the entire input data block. The CTC encoder may then process the entire input data block again with the initial CRCSE state values set to the determined a priori values to generate parity data block. Such a CTC encoder may require numerous processing cycles.

BRIEF DESCRIPTION OF THE DRAWINGS

FIG. 3 is a flow diagram illustrating several methods according to various embodiments.

FIG. 4 is a flow diagram illustrating several methods according to various embodiments.

DETAILED DESCRIPTION

Figure 1:
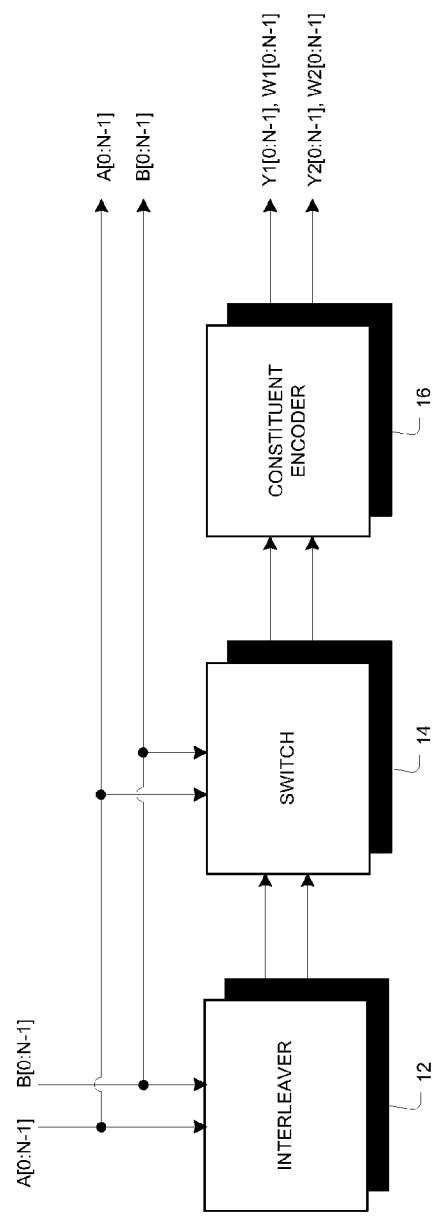
FIG. 1 is a block diagram of a CTC encoder according to various embodiments.

FIG. 1 is a block diagram of a CTC encoder 10 comprising an interleaver 12, a switch 14, and a constituent encoder 16 according to various embodiments. The interleaver 12 may interleave N-sized blocks of binary input data A and B (A[0:N-1], B[0:N-1]). In an embodiment the constituent encoder 16 may generate N-sized blocks of parity data Y1 and W1 from non-interleaved input data A, B depending on the switch 14. The constituent encoder 16 may generate N-sized blocks of parity data Y2 and W2 from interleaved input data A, B blocks depending on the switch 14.

Figure 2:
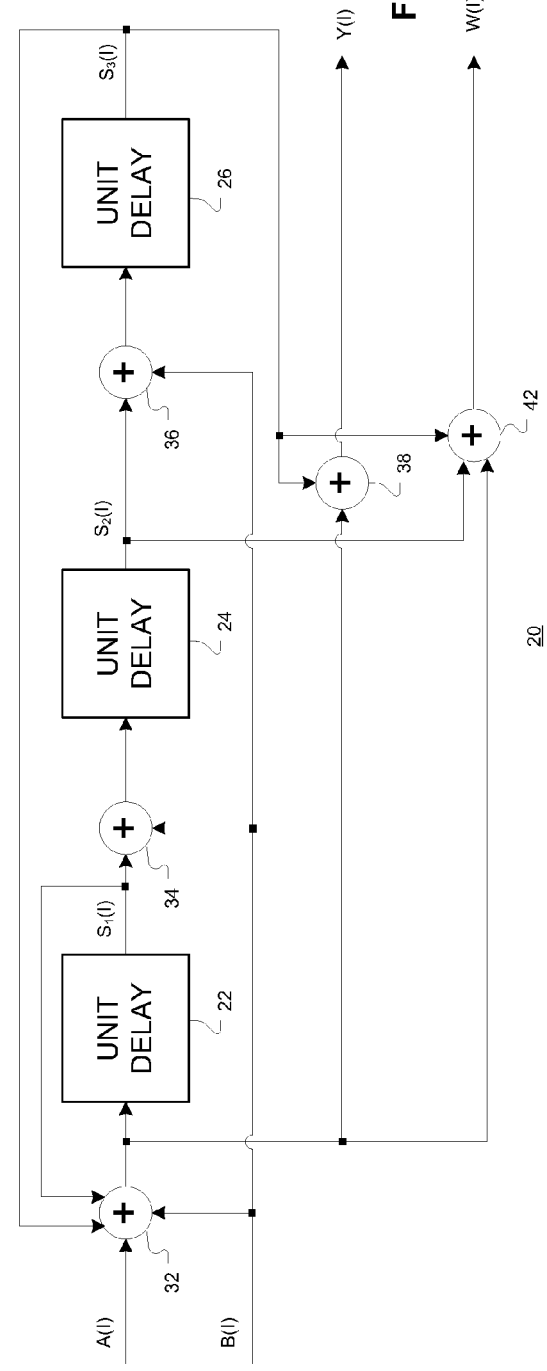
FIG. 2 is a block diagram of a circular-recursive-convolutional systematic encoder (CRCSE) according to various embodiments.

FIG. 2 is a block diagram of a circular-recursive-convolutional systematic encoder (CRCSE) 20 according to various embodiments. The CRCSE 20 receives A, B input binary data and generates binary parity data Y, W. In an embodiment the CRCSE 20 includes three unit delays 22, 24, 26, and five exclusive OR (XOR) modules 32, 34, 36, 38, 42 representing a $3^{rd}$ order polynomial. In an embodiment the encoder feedback is related to the polynomial $1+D+D^3$, Y(I) is related to the polynomial $1+D^2+D^3$, and W(I) is related to the polynomial $1+D^3$. Nominally, the CRCSE 20 state values $S_1(0)$, $S_2(0)$, and $S_3(0)$ are zero at the beginning of data processing. In an embodiment the CRCSE 20 state values $S_1(0)$, $S_2(0)$, and $S_3(0)$ may initialized based on the binary input data blocks A, B.

FIG. 3 is a flow diagram of a CTC encoding method 50 according to various embodiments. In an embodiment, the CTC encoding method 50 may set the (Z) initial state values of an CRCSE to zero where Z is the polynomial order of the CRCSE (activity 52). In an embodiment the CRCSE state values may be zero upon CRCSE start up. Then the CTC encoding method 50 may employ the CRCSE to process or encode the N-sized input data A, B blocks (activity 54). The CTC encoding method 50 may determine a circulation state value, SC based on the final Z state values of the zero-initialized CRCSE after processing the A, B data input blocks.

In an embodiment, the CTC encoding method 50 may determine SC based on SF and NZ where SF is equal to $$\sum_{i=1}^{Z} 2^{(Z-i)} \cdot S_i(N-1),$$

$(4*S_1(N-1)+2*S_2(N-1)+S_3(N-1)$ for $Z=3$) and NZ is equal to (N modulus $(2^Z-1)$), ((N-mod-7) for $Z=3$). The CTC encoding method 50 may use the values, SF and NZ, to determine the value of SC via a two-index Lookup-Table (Table 1 in an embodiment where $Z=3$ and the encoder 20 shown in FIG. 2 is employed) (activity 56).

TABLE 1

| | SC Lookup-Table | | | | | | | |
|---|---|---|---|---|---|---|---|---|
| | | | | SF | | | | |
| N-mod-7 | 0 | 1 | 2 | 3 | 4 | 5 | 6 | 7 |
| 1 | 0 | 6 | 4 | 2 | 7 | 1 | 3 | 5 |
| 2 | 0 | 3 | 7 | 4 | 5 | 6 | 2 | 1 |
| 3 | 0 | 5 | 3 | 6 | 2 | 7 | 1 | 4 |

TABLE 1-continued

SC Lookup-Table

| | SF | | | | | | | |
|---|---|---|---|---|---|---|---|---|
| N-mod-7 | 0 | 1 | 2 | 3 | 4 | 5 | 6 | 7 |
| 4 | 0 | 4 | 1 | 5 | 6 | 2 | 7 | 3 |
| 5 | 0 | 2 | 5 | 7 | 1 | 3 | 4 | 6 |
| 6 | 0 | 7 | 6 | 1 | 3 | 4 | 5 | 2 |

The CTC encoding method 50 may use the binary representation of SC to initialize the CRCSE Z-state binary values, $S_1(0), S_2(0), \ldots S_Z(0)$, e.g., for SC equal to 7 (binary 111) and Z equal to 3, $S_1(0)$ is set to 1, $S_2(0)$ is set to 1, and $S_3(0)$ is set to 1; for SC equal to 4 (binary 100), $S_1(0)$ is set to 1, $S_2(0)$ is set to 0, and $S_3(0)$ is set to 0 (activity 58). The CTC encoding method 50 may employ the SC initialized CRCSE to process the blocks of input data A, B to generate the blocks of parity data Y, W (activity 62). The CTC encoding method 50 may be employed to generate blocks of parity data for blocks of interleaved input data and blocks of non-interleaved input data.

FIG. 4 is a flow diagram of a CTC encoding method 70 according to various embodiments. In an embodiment, the CTC encoding method 70 may set the (Z) initial state values of a CRCSE to zero where Z is the polynomial order of the CRCSE (activity 72). In an embodiment the CRCSE initial state values may be zero upon CRCSE start up. The CTC encoding method 70 may employ the zero initialized CRCSE to process or encode the N-sized input data blocks A, B (activity 74) to generate N-sized parity data blocks YZ, WZ. In an embodiment the N-sized parity blocks YZ, WZ are retained or stored (activity 74). The CTC encoding method 70 may determine a circulation state value, SC based on the (Z) final state values of the CRCSE after processing the A, B data input blocks. The CTC encoding method 70 may use the values, SF and NZ, to determine the value of SC via a two-index Lookup-Table (Table 1 in an embodiment where Z=3) (activity 76).

In an embodiment, the CTC encoding method 70 may use the stored or saved parity data blocks YZ and WZ to determine the parity data blocks Y, W. In an embodiment the saved parity data blocks YZ and WZ may be combined with parity data blocks YS, WS to determine the parity data blocks Y, Z where parity data blocks YS, WS may be created by an CRCSE having initialized state values processing blocks of null input data A, B (blocks of zeros). In an embodiment, Y(I) may be set to YZ(I) XOR YS(I) for I=0 to N-1 and W(I) may be set to WZ(I) XOR WS(I) for I=0 to N-1.

In this embodiment the parity data blocks YS and WS (in this embodiment) have a periodicity of $2^Z-1$ for each possible SC. For a Z order CRCSE, there are $2^Z$ possible SC values. In an embodiment, the CTC encoding method 70 may generate or precompute a zero input (ZI), SC (ZI-SC) YS, WS Lookup-Table (Table 2 in an embodiment where Z=3 for encoder 10 shown in FIG. 2) where the table is indexed by SC and the I-Mod-$2^Z$-1, (I-Mod-7 where Z=3). In Table 2 (for Z=3) there are $2^3$ (8) entries (rows) for SC and $2^3-1$ (7) entries (columns) for each YS and WS given the periodicity of YS and WS and order (Z=3) of the CRCSE (activity 78). In an embodiment, the CTC encoding method 70 may also set the parity index I to zero as a precursor to determining Y(I) and W(I) for I=0 to N. (activity 78). In an embodiment the ZI-SC YS, WS Lookup-Table (Table 2) may be predetermined and stored.

The CTC encoding method 70 may determine each Y(I) parity bit by looking up YS(J) (J=I MOD ($2^Z-1$)) in the ZI-SC YS, WS Lookup-Table (activity 84), retrieving YZ(I) (stored processed value) (activity 86), and setting Y(I) equal to YZ(I) XOR YS(J) (activity 88). Similarly, each W(I) parity bit may be determined by looking up WS(J) in the ZI-SC YS, WS Lookup-Table (activity 84), retrieving WZ(I) (stored encoded value) (activity 86), and setting W(I) equal to WZ(I) XOR WS(J) (activity 88). The CTC encoding method 70 may continue determining Y(I) and W(I) for I from 0 to N-1 (until I is greater than N-1 (block complete) (activities 92, 94)).

TABLE 2

ZI-SC YS, WS Table for Z = 3

| SC | YS response I mod 7 [0:6] | WS response I mod 7 [0:6] |
|---|---|---|
| 0 | 0 0 0 0 0 0 0 | 0 0 0 0 0 0 0 |
| 1 | 0 1 0 0 1 1 1 | 0 1 1 1 0 1 0 |
| 2 | 1 0 1 0 0 1 1 | 0 0 1 1 1 0 1 |
| 3 | 1 1 1 0 1 0 0 | 0 1 0 0 1 1 1 |
| 4 | 1 0 0 1 1 1 0 | 1 1 1 0 1 0 0 |
| 5 | 1 1 0 1 0 0 1 | 1 0 0 1 1 1 0 |
| 6 | 0 0 1 1 1 0 1 | 1 1 0 1 0 0 1 |
| 7 | 0 1 1 1 0 1 0 | 1 0 1 0 0 1 1 |

Figure 5:
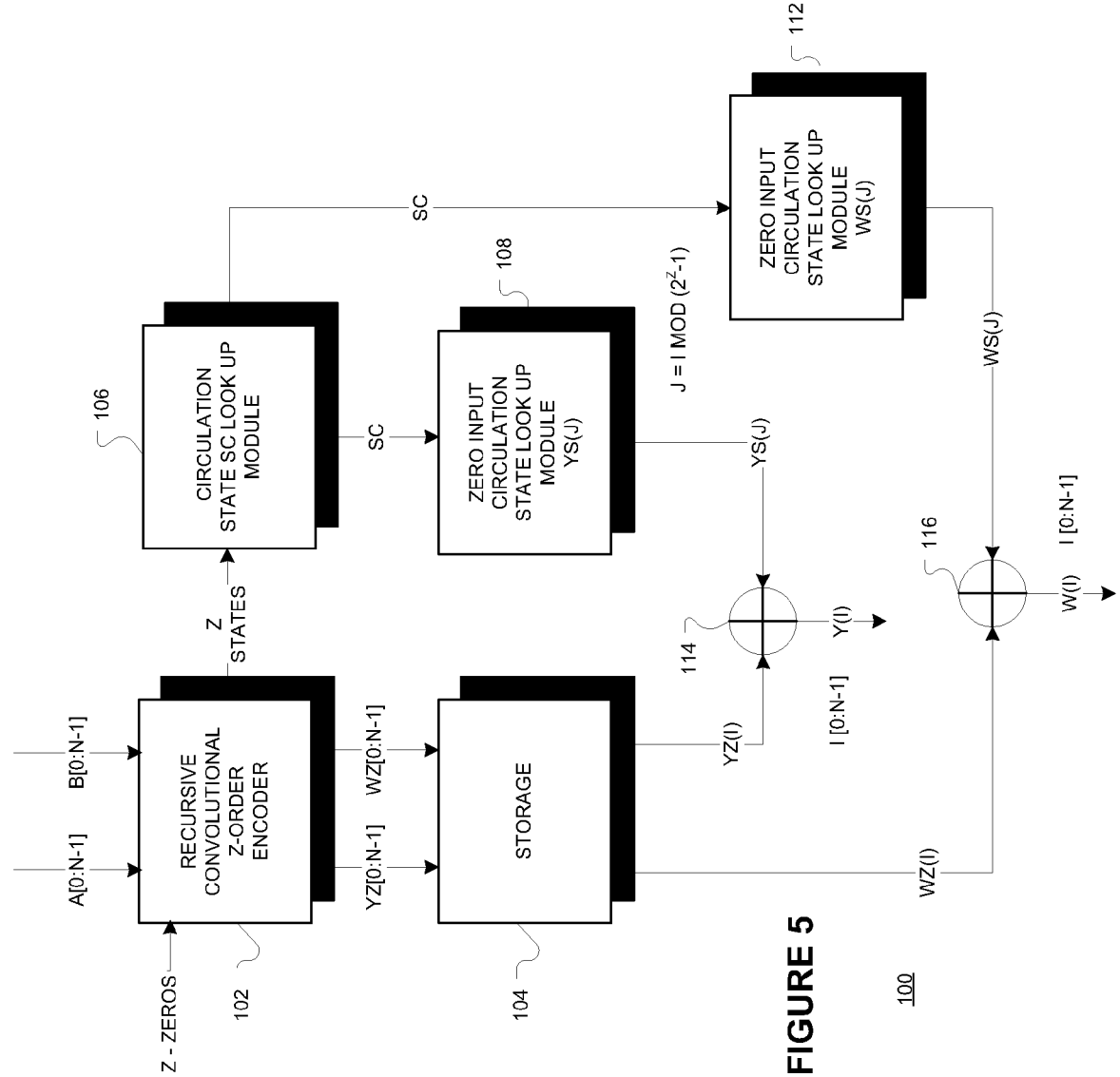
FIG. 5 is a block diagram of a constituent encoder according to various embodiments.

A constituent encoder (CE) 100 is shown in FIG. 5 that may be used in various embodiments. The CE 100 includes a Z-order CRCSE 102, a storage module 104, an SC value look up module 106, a ZI-SC (zero input circulation state) YS look up module 108, a ZI-SC WS look up module 112, an XOR 114, and an XOR 116. In the CE 100, the CRCSE 102 initial state values may be set to zero (or remain zero in an embodiment). The CRCSE 102 may process input data blocks A, B to generate parity data blocks YZ, WZ. The storage module 104 may store the encoded blocks YZ, WZ. The storage module 104 may be random access memory (RAM), a magnetic or optical disc drive, or other electronic memory device. The SC value look up module 106 may determine the corresponding SC value based on the CRCSE 102 final state values 102.

The ZI-SC YS look up module 108 may determine YS(J) based on the determined SC value (determined by SC value look up module 106) where J is equal to I-Mod-($2^Z-1$). The ZI-SC WS look up module 112 may determine WS(J) based on the SC value. In an embodiment XOR 114 may be used to determine Y(I) for I from 0 to N-1 from the values YZ(I) and YS(J) where YZ(I) is retrieved from the storage module 104. XOR 116 may be used to determine W(I) for I from 0 to N-1 from the values WZ(I) and WS(J) where WZ(I) is retrieved from the storage module 104.

Figure 6:
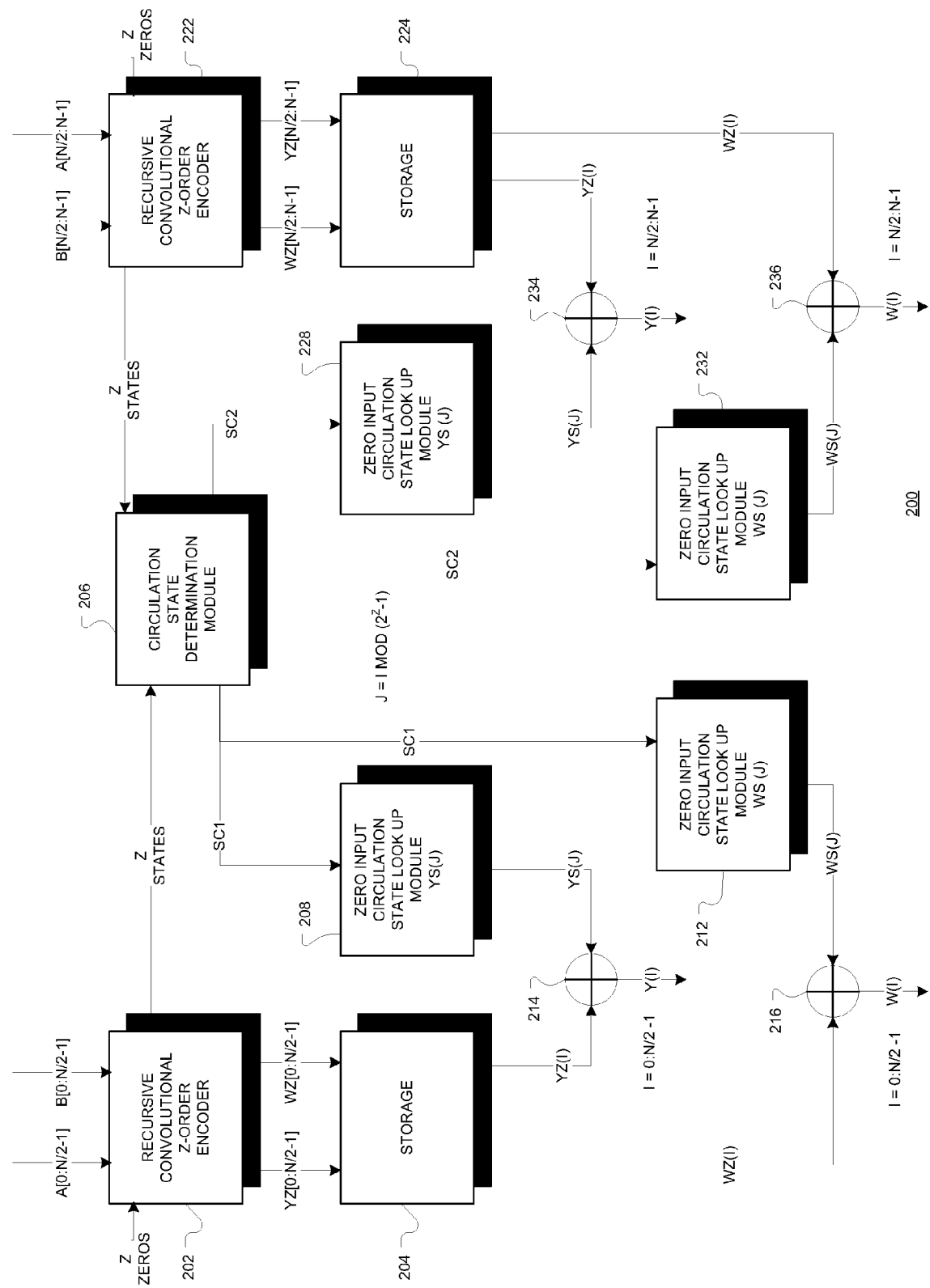
FIG. 6 is a block diagram of a constituent encoder according to various embodiments.

A constituent encoder (CE) 200 is shown in FIG. 6 that may be used in various embodiments. In an embodiment the CE 200 separates N-sized input data blocks A, B into N/2 sized data blocks. In the embodiment the CRCSE 202, the storage module 204, the ZI-SC YS(J) look up module 208, the ZI-SC WS(J) look up module 212, the XOR 214 and the XOR 216 process input data A, B bits 0:N/2-1. In the embodiment the CRCSE 222, the storage 224, the ZI-SC YS(J) look up module 228, the ZI-SC WS(J) look up module 232, the XOR 234 and the XOR 236 process input data A, B bits N/2:N-1. In an embodiment, the processing of the data blocks A[0:N/2-1], B[0:N/2-1] and A[N/2:N-1], B[N/2:N-1] may occur in parallel.

In an embodiment, the CRCSEs' 202, 222 initial state values may be set to zero (or remain zero in an embodiment). The CRCSEs 202, 222 with zeroed initial state values may process input data block segments A, B to generate parity data block segments YZ, WZ. The storage modules 204, 224 may store the parity data block segments YZ, WZ. The storage modules 204, 224 may be random access memory (RAM), a magnetic or optical disc drive, or other electronic memory device. The SC value determination module 206 may determine SC1 and SC2 where SC1 may be used by look up modules 208 and 212 and SC2 may be used by look up modules 228 and 232.

In an embodiment the CRCSE 202 final state values may be used to determine an intermediate value, SF1 and the CRCSE 222 final state values may be used to determine an intermediate value, SF2. A secondary intermediate value, SFS may be determined via a state lookup table (Table 3) where the state lookup table is indexed by SF1 (row) and N-mod-($2^Z$−1) (N-mod-7 where Z=3) (column). In an embodiment SF may then be set equal to SFS XOR SF2. SC1, which is used by ZI-SC YS and WS look up modules 208 and 212, may then be determined via the SC Lookup-Table (Table 1 in an embodiment) where SF is the column and N-MOD-($2^Z$−1) is the column (N-MOD-7 where Z=3). In an embodiment, SC2 may be determined from an intermediate SCIND and SF1. SCIND may be determined via the updated state lookup table (Table 3) by using SC as the row index and N-mod-($2^Z$−1) (N-mod-7 where Z=3) as the column index. In an embodiment SC2 may be set equal to SCIND XOR SF1.

The ZI-SC look up module 208 may determine YS(J) based on SC1 and J and the ZI-SC look up module 212 may determine WS(J) based on SC1 and J. The ZI-SC look up module 228 may determine YS(J) based on SC2 and J and the ZI-SC look up module 232 may determine WS(J) based on SC2 and J. In an embodiment XOR 214 may be used to determine Y(I) (equal to YZ(I) XOR YS(J)) where YZ(I) is retrieved from storage module 204 for I from 0 to N/2−1. XOR 216 may be used to determine W(I) (equal to WZ(I) XOR WS(J)) where WZ(I) is retrieved from storage module 204 for I from 0 to N/2−1. In an embodiment XOR 234 may be used to determine Y(I) (equal to YZ(I) XOR YS(J)) where YZ(I) is retrieved from storage 224 for I from N/2 to N-1. XOR 236 may be used to determine W(I) (equal to WZ(I) XOR WS(J)) where WZ(I) is retrieved from storage 224 for I from N/2 to N-1.

TABLE 3

Updated State

| SF1 or SC | Updated State N-mod-7 [0:6] |
|---|---|
| 0 | 0 0 0 0 0 0 0 |
| 1 | 4 6 7 3 5 2 1 |
| 2 | 1 4 6 7 3 5 2 |
| 3 | 5 2 1 4 6 7 3 |
| 4 | 6 7 3 5 2 1 4 |
| 5 | 2 1 4 6 7 3 5 |
| 6 | 7 3 5 2 1 4 6 |
| 7 | 3 5 2 1 4 6 7 |

Using a similar technique each input data block A, B may be subdivided into 4, or other multiple sub-blocks where each sub-block is separately encoded into its respective parity bits Y, W.

Any of the components previously described can be implemented in a number of ways, including embodiments in software. Thus, the CRCSE 102, the storage module 104, the SC look up module 106, the ZI-SC YS look up module 108, the ZI-SC WS look up module 112, the XOR 114, the XOR 116, the CRCSE 202, the storage module 204, the SC determination module 206, the ZI-SC YS look up module 208, the ZI-SC WS look up module 212, the XOR 214, the XOR 216, the CRCSE 222, the storage 224, the ZI-SC YS look up module 228, the ZI-SC WS look up module 232, the XOR 234, and the XOR 236 may all be characterized as "modules" herein.

The modules may include hardware circuitry, single- or multi-processor circuits, memory circuits, software program modules and objects, firmware, and combinations thereof, as desired by the architect of the CTC encoders 100, 200 and as appropriate for particular implementations of various embodiments.

The apparatus and systems of various embodiments may be useful in applications other than determining parity data for input data. They are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, single- or multi-processor modules, single or multiple embedded processors, data switches, and application-specific modules, including multi-layer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 players), vehicles, medical devices (e.g., heart monitors, blood pressure monitors, etc.) and others. Some embodiments may include a number of methods.

It may be possible to execute the activities described herein in an order other than the order described. Various activities described with respect to the methods identified herein can be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment. Thus, other embodiments may be realized, as discussed regarding FIG. 7 below.

Figure 7:
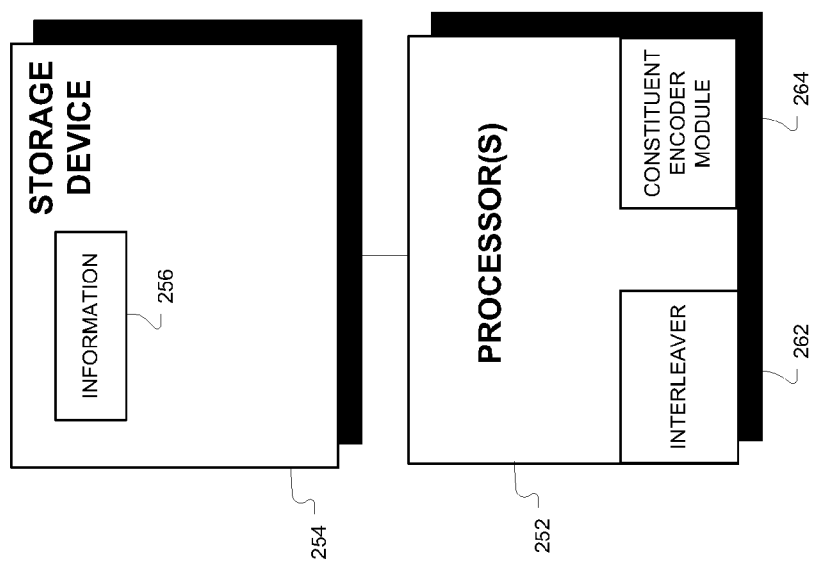
FIG. 7 is a block diagram of an article according to various embodiments.

FIG. 7 is a block diagram of an article 250 according to various embodiments of the invention. Examples of such embodiments may comprise a computer, a memory system, a magnetic or optical disk, some other storage device, or any type of electronic device or system. The article 250 may include one or more processor(s) 252 coupled to a machine-accessible medium such as a storage device 254 (e.g., a memory including electrical, optical, or electromagnetic elements). The storage device 254 may contain associated information 256 (e.g., computer program instructions, data, or both) which, when accessed, results in a machine (e.g., the processor(s) 252) performing the activities previously described. The storage device 254 may also contain blocks of input data, blocks of interleaved input data, blocks of encoded data, and blocks of parity data. The processor 252 may include an interleaver 262 to interleave blocks of input data. The processor 252 may also include a constituent encoder module 264 to generate blocks of parity data from blocks of input data. In an embodiment the processor(s) 252, interleaver 262, and constituent encode module may be separate elements or modules.

Although the inventive concept may include embodiments described in the exemplary context of an IEEE standard 802.xx implementation (e.g., 802.11, 802.11a, 802.11b, 802.11e, 802.11g, 802.16, etc.), the claims are not so limited. Additional information regarding the IEEE 802.16 protocol standard may be found in IEEE Std 802.16, Supplement to IEEE Standard for Information technology—Telecommunications and information exchange between systems—Local and metropolitan area networks-Specific requirements Part 11: Wireless LAN Medium Access Control (MAC) and Physical Layer (PHY) specifications—High-speed Physical Layer in the 5 GHz Band (published 1999; reaffirmed Jun. 12, 2003). Additional information regarding the IEEE 802.11b protocol standard may be found in IEEE Std 802.11b, Supplement to IEEE Standard for Information technology—Telecommunications and information exchange between systems—Local and metropolitan area networks—Specific Requirements—Part 11: Wireless LAN Medium Access Control (MAC) and Physical Layer (PHY) specifications: Higher-Speed Physical Layer Extension in the 2.4 GHz Band (approved Sep. 16, 1999; reaffirmed Jun. 12, 2003). Additional information regarding the IEEE 802.11g protocol standard may be found in IEEE Std 802.11g, IEEE Standard for Information technology—Telecommunications and information exchange between systems—Local and metropolitan area networks-Specific Requirements Part 11: Wireless LAN Medium Access Control (MAC) and Physical Layer (PHY) specifications Amendment 4: Further Higher Data Rate Extension in the 2.4 GHz Band (approved Jun. 12, 2003). Embodiments of the present invention may be implemented as part of any wired or wireless system. Examples may also include embodiments comprising multi-carrier wireless communication channels (e.g., orthogonal frequency division multiplexing (OFDM), discrete multitone (DMT), etc. such as may be used within a wireless personal area network (WPAN), a wireless local area network (WLAN), a wireless metropolitan are network (WMAN), a wireless wide area network (WWAN), a cellular network, a third generation (3G) network, a fourth generation (4G) network, a universal mobile telephone system (UMTS), and like communication systems, without limitation.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A constituent encoder module, including:
   an encoder to encode a block of input data into a block of encoded data, the encoder having state values; and
   a combiner to combine the block of encoded data with data that varies as a function of the encoder's state values to generate a block of parity data, wherein the encoder is a circular recursive convolutional encoder and the state values are related to the encoder's final state values.

2. The constituent encoder module of claim 1, the module further including a look up module to look up the data that varies as a function of the encoder's final states.

3. The constituent encoder module of claim 2, wherein the encoder has at least three delays.

4. The constituent encoder module of claim 2, wherein the data that varies as a function of the encoder's state values is generated by initializing the encoder's state values.

5. The constituent encoder module of claim 2, wherein the data that varies as a function of the encoder's state values is generated by initializing the encoder's state values and providing the encoder with a block of zero data.

6. The constituent encoder module of claim 5, wherein the data that varies as a function of the encoder's state values have a periodicity related to the number of encoder delays.

7. A constituent encoder module, including:
   an encoder to encode a block of input data into a block of encoded data, the encoder having state values;
   a combiner to combine the block of encoded data with data that varies as a function of the encoder's state values to generate a block of parity data; and
   storage to store the block of encoded data.

8. The constituent encoder module of claim 7, wherein the combiner includes one of adds, multiplies, ors, and exclusive ors the block of encoded data with data that varies as a function of the encoder's state values to generate a block of parity data.

9. A system, including:
   an interleaver to interleave a block of input data;
   a constituent encoder module, comprising:
      an encoder to encode a block of input data into a block of encoded data, the encoder having state values; and
      a combiner to combine the block of encoded data with data that varies as a function of the encoder's state values to generate a block of parity data; and a storage device coupled to the constituent encoder module to store at least one of the block of input data and the block of encoded data.

10. The system of claim 9, wherein the encoder is a circular recursive convolutional encoder and the state values are related to the encoder's final state values.

11. The system of claim 10, the module further including a look up module to look up the data that varies as a function of the encoder's final state values.

12. The system of claim 10, wherein the data that varies as a function of the encoder's state values is generated by initializing the encoder's state values and providing the encoder with a block of zero data.

13. The system of claim 9, wherein the combiner includes one of adds, multiplies, ors, and exclusive ors the block of encoded data with data that varies as a function of the encoder's state values to generate a block of parity data.

14. The system of claim 9, wherein the system is integrated into at least one of a device capable of operating according to an Institute of Electrical and Electronics Engineers (IEEE) 802.11 family of standards or a device capable of operating according to an IEEE 802.16 family of standards.

15. A method, including:
at an encoder in a constituent encoder, encoding a block of input data into a block of encoded data, the encoder having state values; and
at a combiner, combining the block of encoded data with data that varies as a function of the encoder's state values to generate a block of parity data, the encoder having multiple delays and the state values being related to the encoder's state values after encoding the block of input data and the method further including at a look up module, looking up data that varies as a function of the encoder's state values after encoding the block of input data.

16. The method of claim 15, wherein the combining includes one of adding, multiplying, oring, and exclusive oring the block of encoded data with data that varies as a function of the encoder's state values to generate a block of parity data.

17. The method of claim 15, further including at the encoder, initializing the encoder's state values and encoding a block of zero data to generate the data that varies as a function of the encoder's state values.

18. An article including a machine-accessible medium having associated information, wherein the information, when accessed, results in a machine performing:
at an encoder in a constituent encoder, encoding a block of input data into a block of encoded data, the encoder having state values; and
at a combiner, combining the block of encoded data with data that varies as a function of the encoder's state values to generate a block of parity data, wherein the information, when accessed, results in the machine performing, at the encoder, initializing the encoder's state values and encoding a block of zero data to generate the data that varies as a function of the encoder's state values.

19. The article of claim 18, wherein the information, when accessed, results in the machine performing looking up data that varies as a function of the encoder's state values, the encoder having multiple delays and the state values being related to the encoder's final state values after encoding the block of input data.

20. The article of claim 18, wherein the information, when accessed, results in the machine performing, at the combiner, one of adding, multiplying, oring, and exclusive oring the block of encoded data with data that varies as a function of the encoder's state values to generate a block of parity data.

* * * * *

UNITED STATES PATENT AND TRADEMARK OFFICE
CERTIFICATE OF CORRECTION

| | | |
|---|---|---|
| PATENT NO. | : 7,853,858 B2 | Page 1 of 1 |
| APPLICATION NO. | : 11/617251 | |
| DATED | : December 14, 2010 | |
| INVENTOR(S) | : Kamal J. Koshy et al. | |

It is certified that error appears in the above-identified patent and that said Letters Patent is hereby corrected as shown below:

IN THE CLAIMS:

In column 8, line 37, in Claim 4, delete "claim 2," and insert -- claim 1, --, therefor.

In column 8, line 40, in Claim 5, delete "claim 2," and insert -- claim 1, --, therefor.

Signed and Sealed this
Twenty-ninth Day of March, 2011

David J. Kappos
*Director of the United States Patent and Trademark Office*